(12) United States Patent
Chen et al.

(10) Patent No.: US 8,341,842 B2
(45) Date of Patent: Jan. 1, 2013

(54) METHOD OF MANUFACTURING HEAT SINK

(75) Inventors: Guo Chen, Shenzhen (CN); Peng Liu, Shenzhen (CN); Shi-Wen Zhou, Shenzhen (CN); Chun-Chi Chen, Taipei Hsien (TW)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 691 days.

(21) Appl. No.: 12/537,267

(22) Filed: Aug. 7, 2009

(65) Prior Publication Data

US 2010/0258287 A1 Oct. 14, 2010

(30) Foreign Application Priority Data

Apr. 8, 2009 (CN) .......................... 2009 1 0301386

(51) Int. Cl.
*B21D 53/00* (2006.01)
(52) U.S. Cl. .................. 29/890.04; 29/890.03; 165/80.3
(58) Field of Classification Search ............... 29/890.03, 29/890.038, 890.039, 890.04; 165/80.3, 165/80.4, 185, 104.33, 104.34
See application file for complete search history.

(56) References Cited

U.S. PATENT DOCUMENTS

| | | | | |
|---|---|---|---|---|
| 4,733,453 A | * | 3/1988 | Jacoby | 29/432 |
| 5,499,450 A | * | 3/1996 | Jacoby | 29/890.03 |
| 5,988,266 A | * | 11/1999 | Smith et al. | 165/78 |
| 6,088,917 A | * | 7/2000 | Lee et al. | 29/890.03 |
| 6,134,783 A | * | 10/2000 | Bargman et al. | 29/890.03 |
| 6,223,815 B1 | * | 5/2001 | Shibasaki | 165/185 |
| 6,230,789 B1 | * | 5/2001 | Pei et al. | 165/80.3 |
| 6,296,048 B1 | * | 10/2001 | Sauer | 165/80.3 |
| 6,356,445 B1 | * | 3/2002 | Mochzuki et al. | 361/697 |
| 6,357,514 B1 | * | 3/2002 | Sasaki et al. | 165/80.3 |
| 7,117,930 B2 | * | 10/2006 | Todd et al. | 165/104.21 |
| 8,004,843 B2 | * | 8/2011 | Chen et al. | 361/700 |
| 2010/0243229 A1 | * | 9/2010 | Liu et al. | 165/185 |

* cited by examiner

*Primary Examiner* — David Bryant
*Assistant Examiner* — Ryan J Walters
(74) *Attorney, Agent, or Firm* — Altis Law Group, Inc.

(57) ABSTRACT

A method of manufacturing a heat sink includes, firstly, providing a plurality of fins each having a head and a body extending from the head, providing a base having a plurality of studs protruding from a top surface thereof, and providing a cover defining a plurality of recesses in a bottom thereof for receiving the heads of the fins and a plurality of orfices for receiving the studs. Next, the cover and the base are pressed to sandwich the heads of the fins therebetween. Then the studs of the base are punched to expand the studs and cause the studs to intimately engage with the cover.

3 Claims, 4 Drawing Sheets

METHOD OF MANUFACTURING HEAT SINK

BACKGROUND

1. Technical Field

The present disclosure relates generally to a method of manufacturing a heat sink having a base and a cover securing heads of columned fins therebetween.

2. Description of Related Art

Generally, in order to ensure the normal running of an electronic device, a heat sink is used to dissipate heat generated by the electronic device. A conventional heat sink includes a base and a plurality of fins integrally extending from the base. However, lengths of the fins are limited by a material performance. Thus, a surface area of the fins is restricted, which impacts heat dissipation effect of the heat sink. For increasing the surface area of the fins, the base and the fins are separated first and then combined by solder or other means. Nevertheless, a cost of manufacturing the heat sink increases.

What is needed therefore is a convenient and easy method for manufacturing a heat sink having a good heat dissipating capability.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

Figure 1:
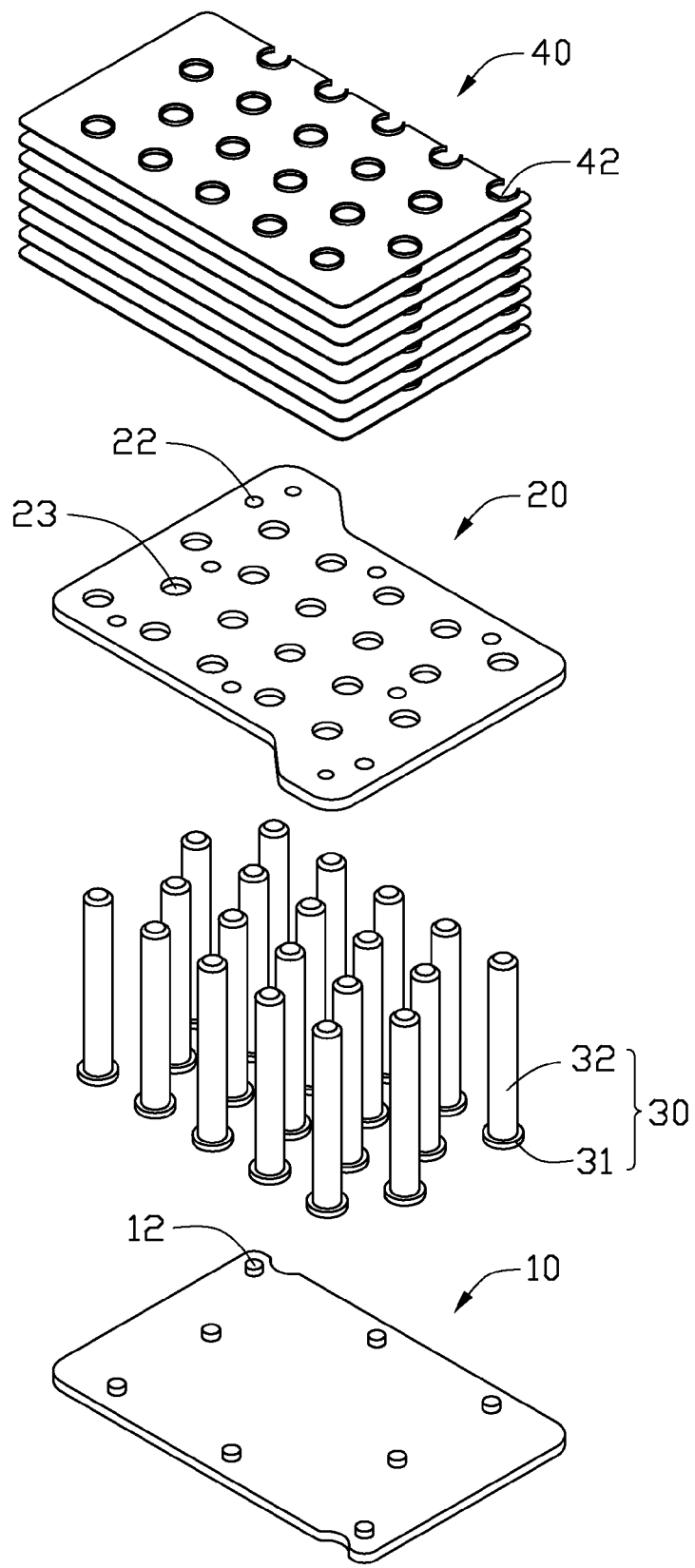
FIG. 1 is an isometric, exploded view of a heat sink in accordance with an embodiment of the present disclosure.
Figure 2:
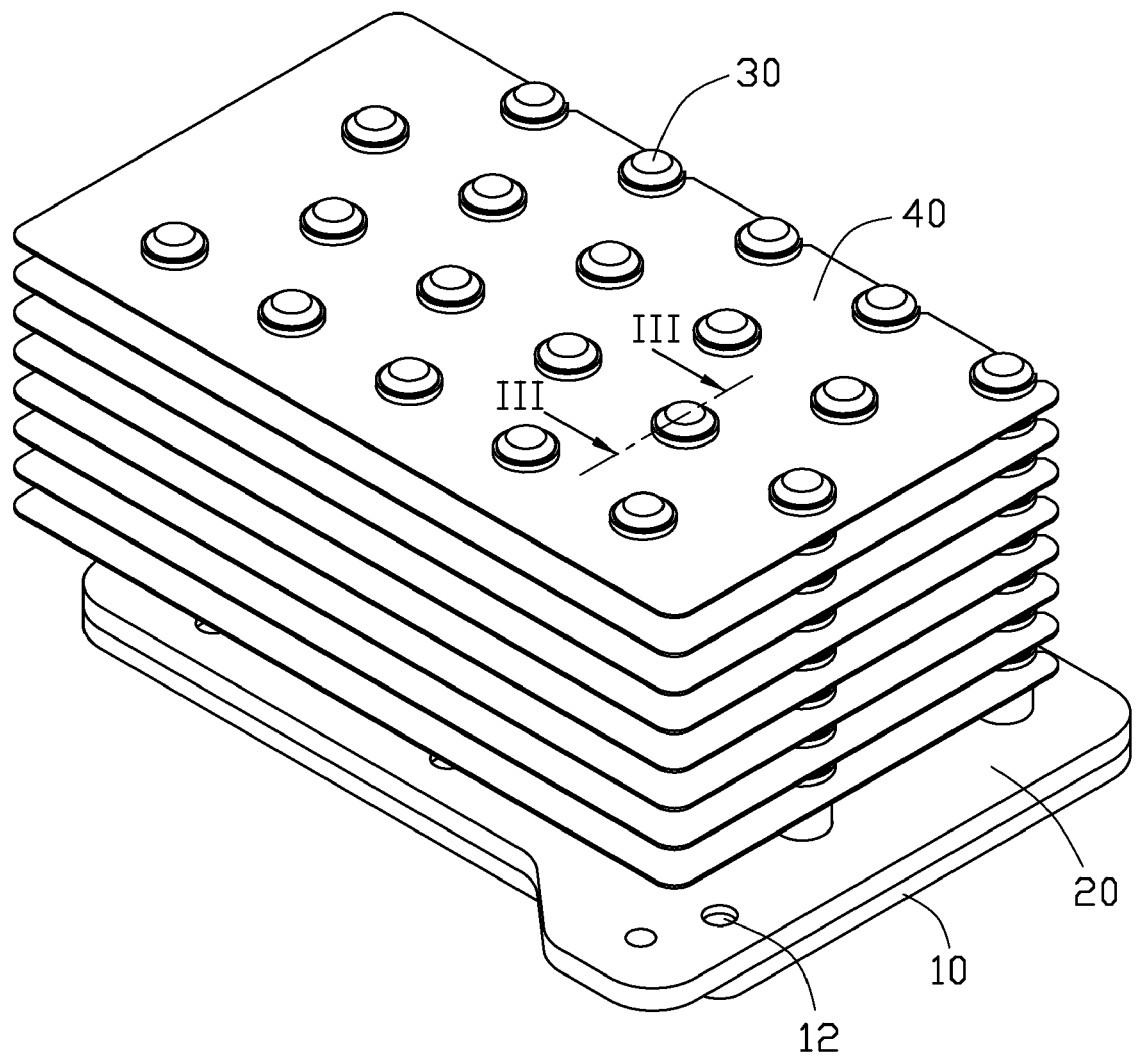
FIG. 2 is an assembled view of the heat sink of FIG. 1.

FIG. 1 and FIG. 2 illustrate a heat sink in accordance with an embodiment of the present disclosure. The heat sink dissipates heat from a heat-generating component such as a CPU (not shown). The heat sink comprises a base 10, a cover 20 mounted on the base 10, a plurality of columned fins 30 arranged on the base 10 and secured by the cover 20, and a plurality of plate fins 40 engaged on the columned fins 30. Each of the base 10, the cover 20, and the columned fins 30 and plate fins 40 is made of material having good heat conductivity, such as aluminum.

Figure 3:
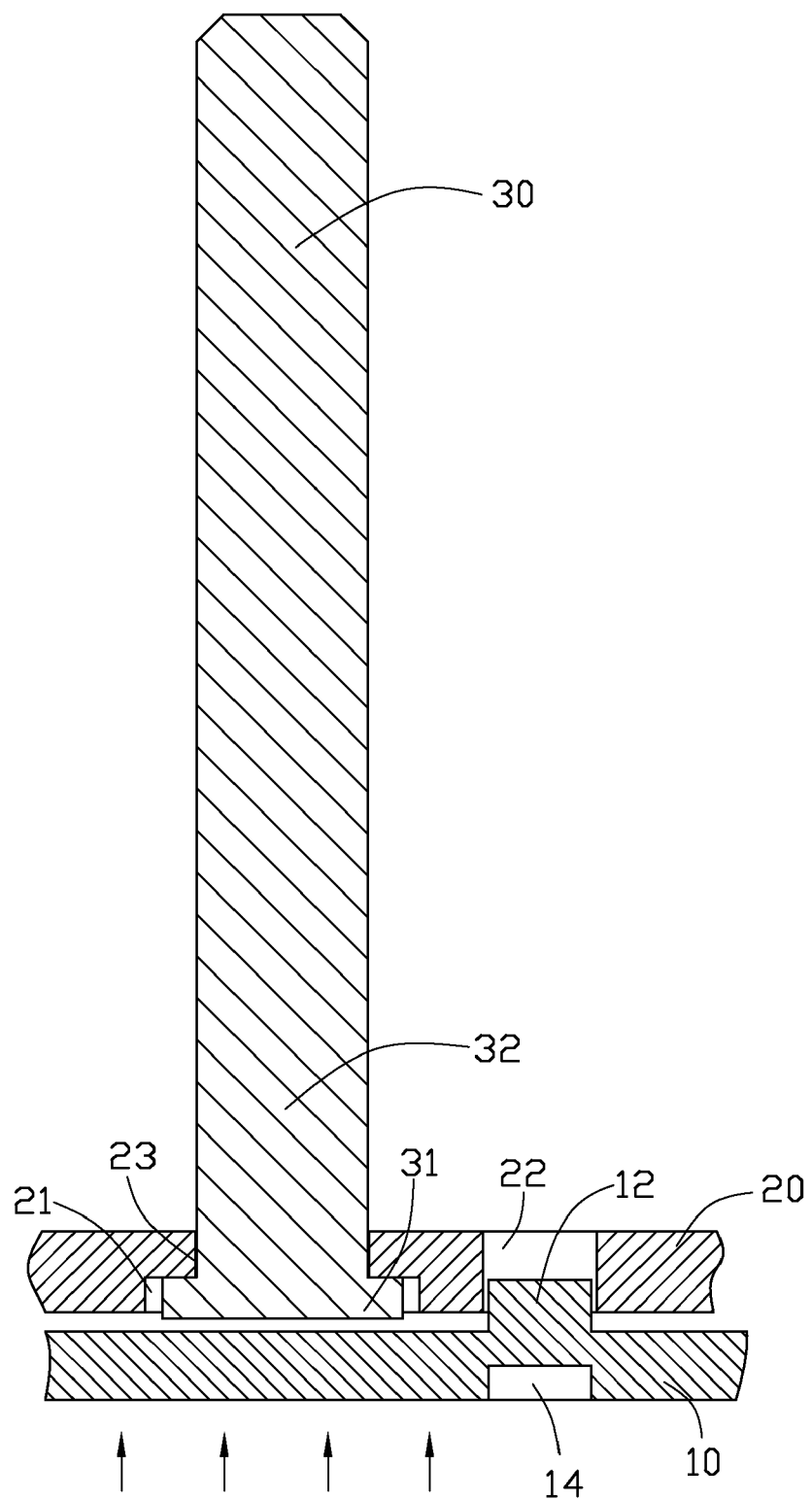
FIG. 3 is a cross-sectional view of the heat sink of FIG. 2 taken along line III-III thereof, when a base is pressed to a cover.

Also referring to FIG. 3, a bottom of the base 10 is for contacting the heat-generating component. A plurality of columned studs 12 protrudes on the base 10 along an edge of the base 10. In other embodiment, the studs 12 can be distributed on the base 10 in another pattern. The studs 12 are integrally formed on the base 10 by punching. Thus, a concave 14 is defined in the bottom of the base 10 corresponding to each stud 12.

The cover 20 has a plate shape and a thickness equal to that of the base 10. A plurality of through holes (not labeled) extend through the cover 20, in which each through hole has a circular recess 21 defined in a bottom of the cover 20 and a circular passage 23 defined in a top of the cover 20 and communicating with the recess 21. The passage 23 is smaller than the recess 21. A plurality of orifices 22 is defined in the cover 20 corresponding to the studs 12 of the base 10. A diameter of each orifice 22 is slightly larger than that of each stud 12.

Each columned fin 30 comprises a head 31 and a body 32 extending therefrom. Understandably the columned fins 30 can be square, prism or other shape in alternative embodiments. The head 31 is bigger than the body 32; that is to say, the head 31 has a diameter larger than that of the body 32, and the columned fin 30 has a T-shaped profile in lengthwise cross-section (see FIG. 3). The head 31 is received in the recess 21 of the cover 20. The head 31 is slightly higher than the recess 21; it is to say that the head 31 has a height larger than a depth of the recess 21. Preferably, the head 31 is 0.05-0.15 mm higher than the recess 21. Thus, bottom end of the head 31 extends out of the recess 21. The body 32 is slightly smaller than the passage 23 of the cover 20, and the head 31 is bigger than the passage 23 i.e., the passage 23 having a diameter thereof larger than that of the body 32, but less than that of the head 31, whereby the passage 23 of the cover 20 can be extended by the body 32, and the cover 20 can be mounted on the top end of the head 31 to secure the head 31 between the base 10 and the cover 20.

The plate fins 40 are parallel to each other. A plurality of holes 42 are defined in the plate fins 40 to allow the bodies 32 of the columned fins 30. The bodies 32 of the columned fins 30 interferentially extend through the holes 42, thereby securing the plate fins 40 on the bodies 32 of the columned fins 30.

Figure 4:
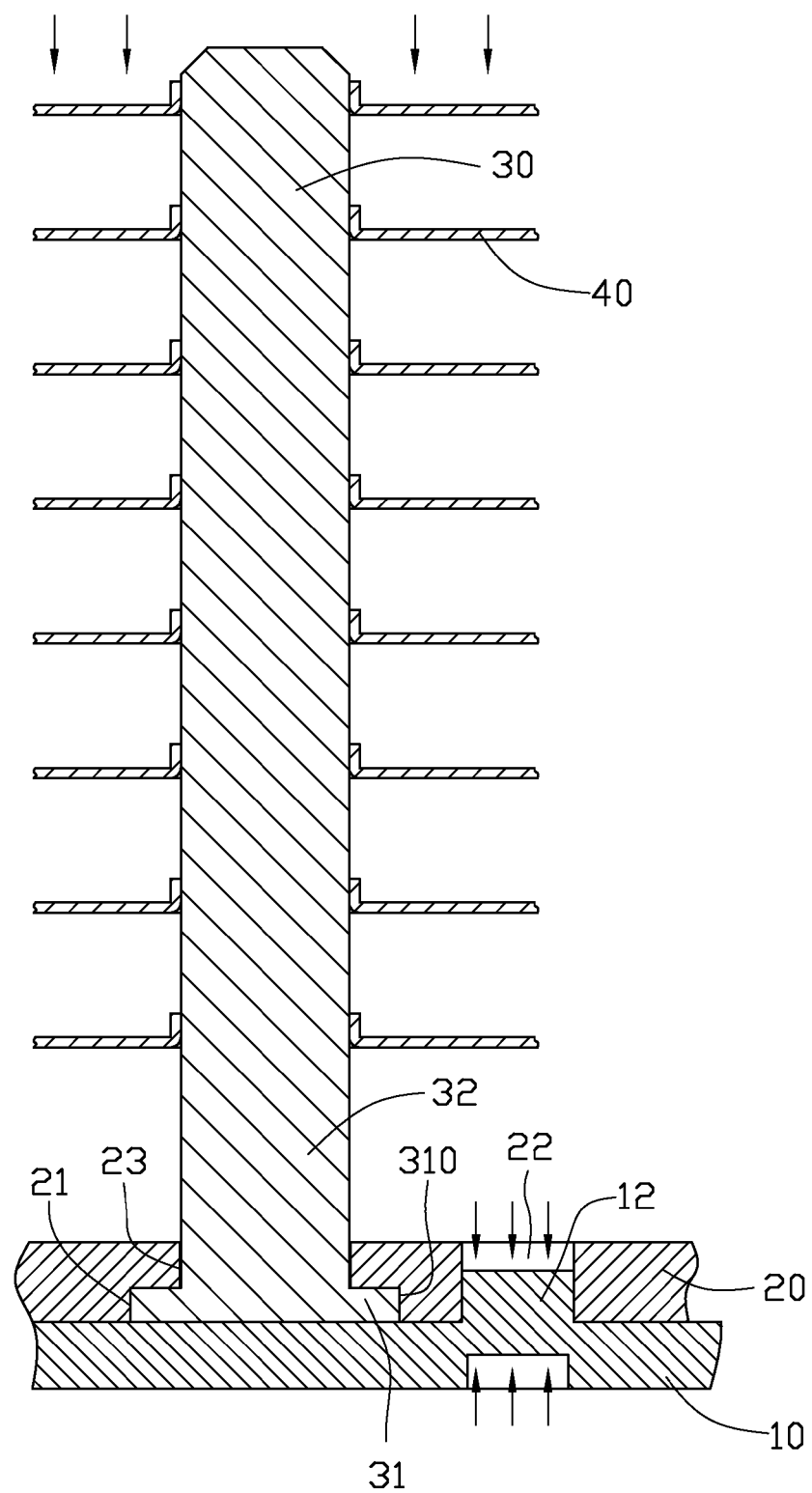
FIG. 4 is a view similar to FIG. 3, showing that studs of the base have been punched.

In assembly, the bodies 32 extend through the passages 23 of the cover 20 from the bottom of the cover 20, and the heads 31 are received in the recesses 21 of the cover 20. Since each head 31 has a diameter smaller than that of the recess 21, an annular gap is defined between the head 31 and the cover 20. Since each head 31 is slightly higher than the recess 21, the bottom end of the head 31 extends out of the recess 21. The base 10 is pressed upwardly toward the cover 20 whereby the base 10 contacts the bottom ends of the heads 31. Each of the heads 31 is pressed to deform and expands to form an annular deforming part 310 which fills in the gap, and to have a bottom surface coplanar to a bottom surface of the cover 20; thus, the base 10 intimately contacts the bottoms of the cover 20 and the heads 31 of the columned fin 30. Simultaneously, the studs 12 of the base 10 are received in the orifices 22 of the cover 20. Also referring to FIG. 4, a top and a bottom of the studs 12 are punched to deform thereby to rivet the studs 12 into the orifices 22 and intimately joint the base 10 and the cover 20 together. At last, the plate fins 40 are interferentially engaged with the bodies 32 of the columned fins 30 and secured thereon.

A heat conducting grease can be filled between the heads 31 of the columned fins 30 and the recesses 21 of the cover 20 to reduce heat resistance therebetween.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A method of manufacturing a heat sink, comprising:
providing a plurality of columned fins each having a head and a body extending from the head;
providing a base protruding a plurality of studs from a top surface thereof;

providing a cover defining a plurality of recesses in a bottom thereof for receiving the heads of the fins and a plurality of orifices thereof for receiving the studs, each head having a height with 0.05-0.15 mm larger than a depth of the corresponding recess of the cover so that a bottom surface of the head extends beyond a bottom surface of the cover, and an annular gap being defined between a periphery of each head and an inside wall in each recess of the cover;

pressing the cover and the base to sandwich the heads of the fins therebetween, whereby each head is expanded to fill in the annular gap and contacts the inside wall in the corresponding recess of the cover, and the bottom surface of each head is coplanar to the bottom surface of the cover; and punching the studs of the base to expand studs and cause the studs to intimately engage with the cover.

2. The method as claimed in claim 1, further comprising a step of pressing a plurality of plate fins on the bodies of the fins.

3. The method as claimed in claim 1, wherein a grease is filled between the recesses of the base and the heads of the fins.

* * * * *